United States Patent
Goller et al.

(10) Patent No.: US 7,369,068 B2
(45) Date of Patent: May 6, 2008

(54) METHOD OF RECOVERING DIGITAL DATA FROM A CLOCKED SERIAL INPUT SIGNAL AND CLOCKED DATA RECOVERY CIRCUIT

(75) Inventors: Joerg Goller, Zweikirchen (DE); Antonio Priego, Freising (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 11/374,929

(22) Filed: Mar. 14, 2006

(65) Prior Publication Data
US 2007/0075877 A1  Apr. 5, 2007

(30) Foreign Application Priority Data
Mar. 23, 2005  (DE) ...................... 10 2005 013 482

(51) Int. Cl.
*H03M 7/00* (2006.01)
(52) U.S. Cl. .................... 341/61; 341/100; 341/101
(58) Field of Classification Search ............... 375/371; 345/519; 341/61, 100, 101
See application file for complete search history.

(56) References Cited

U.S. PATENT DOCUMENTS

| | | | |
|---|---|---|---|
| 4,941,156 A | 7/1990 | Stern et al. | |
| 5,951,635 A | 9/1999 | Kamgar et al. | |
| 6,057,789 A | 5/2000 | Lin et al. | |
| 6,538,656 B1 * | 3/2003 | Cheung et al. | 345/519 |
| 2004/0028164 A1 * | 2/2004 | Jiang et al. | 375/371 |

FOREIGN PATENT DOCUMENTS

| | | |
|---|---|---|
| DE | 19922807 C2 | 5/1999 |
| DE | 102004014695 A1 | 3/2004 |

* cited by examiner

*Primary Examiner*—Jean B Jeanglaude
(74) *Attorney, Agent, or Firm*—Wade J. Brady, III; Frederick J. Telecky, Jr.; Warren L. Franz

(57) ABSTRACT

Digital data are recovered from a clocked serial input signal. The input signal is sampled with a sampling clock signal supplied by a first phase interpolator to obtain a sampled digital signal. The first phase interpolator is controlled with a voting circuit to adjust the phase of the sampling clock relative to the eye in the eye-diagram of the input signal. The first phase interpolator has signal inputs connected to signal outputs of a voltage controlled oscillator in a phase-locked loop circuit that has a reference signal input to which the reference clock signal is applied. The sampled digital signal is written to a single-bit FIFO buffer with a write clock signal that has the same timing as the sampling clock. A filtered output signal is read from the FIFO buffer with a read clock signal supplied by a second phase interpolator that has signal inputs connected to the signal outputs of the voltage controlled oscillator in the phase-locked loop. The second phase interpolator is controlled with a pointer monitor that monitors the write and read select pointers in the FIFO buffer to adjust the timing of the read clock signal relative to the write clock signal. With this method, the hunting jitter is filtered out while a frequency offset is still allowed between the reference clock and the data signal.

9 Claims, 4 Drawing Sheets

METHOD OF RECOVERING DIGITAL DATA FROM A CLOCKED SERIAL INPUT SIGNAL AND CLOCKED DATA RECOVERY CIRCUIT

CROSS REFERENCE TO RELATED APPLICATION

This application claims priority under 35 USC § 119 of German Application Serial No. 10 2005 013482.3, filed Mar. 23, 2005.

FIELD OF THE INVENTION

The present invention relates to a method of recovering digital data from a clocked serial input signal and to a clocked data recovery circuit.

BACKGROUND OF THE INVENTION

In a digital system with serial transmission of data, a received signal may be related to a system clock of a transmitter (a "clocked signal"). The frequency of the received signal is the same as the clock frequency. In a real environment, however, the timing relation between the received signal and the system clock will vary slightly. Deviations in frequency of several hundreds of ppm will normally be observed. On the side of the receiver, these deviations, referred to as "jitter", must be detected and compensated by sampling the received data with a clock that is adjusted in phase in an attempt to center the sampling point with respect to the eye in the eye-diagram of the input signal. The required phase adjustments to center the sampling point within the eye occur stepwise as a result of conditions determined by a voting unit. Due to the jitter in the received signal, however, the voting process may be misled, and phase adjustments occur that are later recognized as inadequate. In such cases, corrective phase adjustments are made to move the sampling phase back to an earlier condition. As a result, the sampling phase is moved back and forth, and the recovered signal also has jitter on it. This kind of jitter is called "hunting jitter".

SUMMARY OF THE INVENTION

The present invention provides a method and a circuit for post-processing of the sample output to substantially reduce the hunting jitter.

Specifically, the invention provides a method of recovering digital data from a clocked serial input signal wherein the input signal is sampled with a sampling clock signal. The sampled digital signal is written to a single-bit FIFO buffer with a write clock signal that has the same timing as the sampling clock. A filtered output signal is read from the FIFO buffer with a read clock signal supplied by a phase interpolator that has signal inputs receiving two different ones of mutually phase-shifted clock signals synchronized with the sampling clock. The phase interpolator is controlled with a pointer monitor that monitors the write and read select pointers in the FIFO buffer to adjust the timing of the read clock signal relative to the write clock signal. With this method, the hunting jitter is filtered out while a frequency offset is still allowed between the reference clock (from which the sampling clock is derived) and the data signal. Essentially, the read and write pointers of the FIFO are monitored to detect a frequency offset. When a frequency offset is detected, the phase of the read clock is adjusted.

In the preferred embodiment, the pointer monitor controls the phase interpolator in a manner to force a phase step when, and only when, the amount of a timing offset between the write and read select pointers in the FIFO buffer exceeds a preset limit. The preset limit is determined in relation to the depth of the FIFO buffer to ensure a safety margin between write and read operations while minimizing the frequency of phase steps of the phase interpolator. As a result, the jitter caused by the phase steps of the read clock is minimized.

The invention also provides a clocked data recovery circuit. In the inventive circuit, a sampling circuit has a signal input for application of a clocked serial input signal, a signal output and a sampling clock input for application of a sampling clock signal. A single-bit FIFO buffer has a data input connected to the signal output of the sampling circuit, a data output, a write clock input connected to the output of the first phase interpolator and a read clock input. A phase interpolator has two signal inputs, a phase control input and an output connected to the read clock input of the FIFO buffer. A multiplexer has a control input for selectively connecting the two signal inputs of the phase interpolator to two different ones of mutually phase-shifted clock signals synchronized with the sampling clock. A pointer monitor monitors write and read select pointers in the FIFO buffer to adjust the timing of the read clock relative to the write clock so that a timing offset between the write and read select pointers in the FIFO buffer is maintained within preset limits.

BRIEF DESCRIPTION OF THE DRAWINGS

Further advantages and features of the invention will become apparent from the following description with reference to the appending drawings. In the drawings.

DETAILED DESCRIPTION OF THE DRAWINGS

Figure 1:
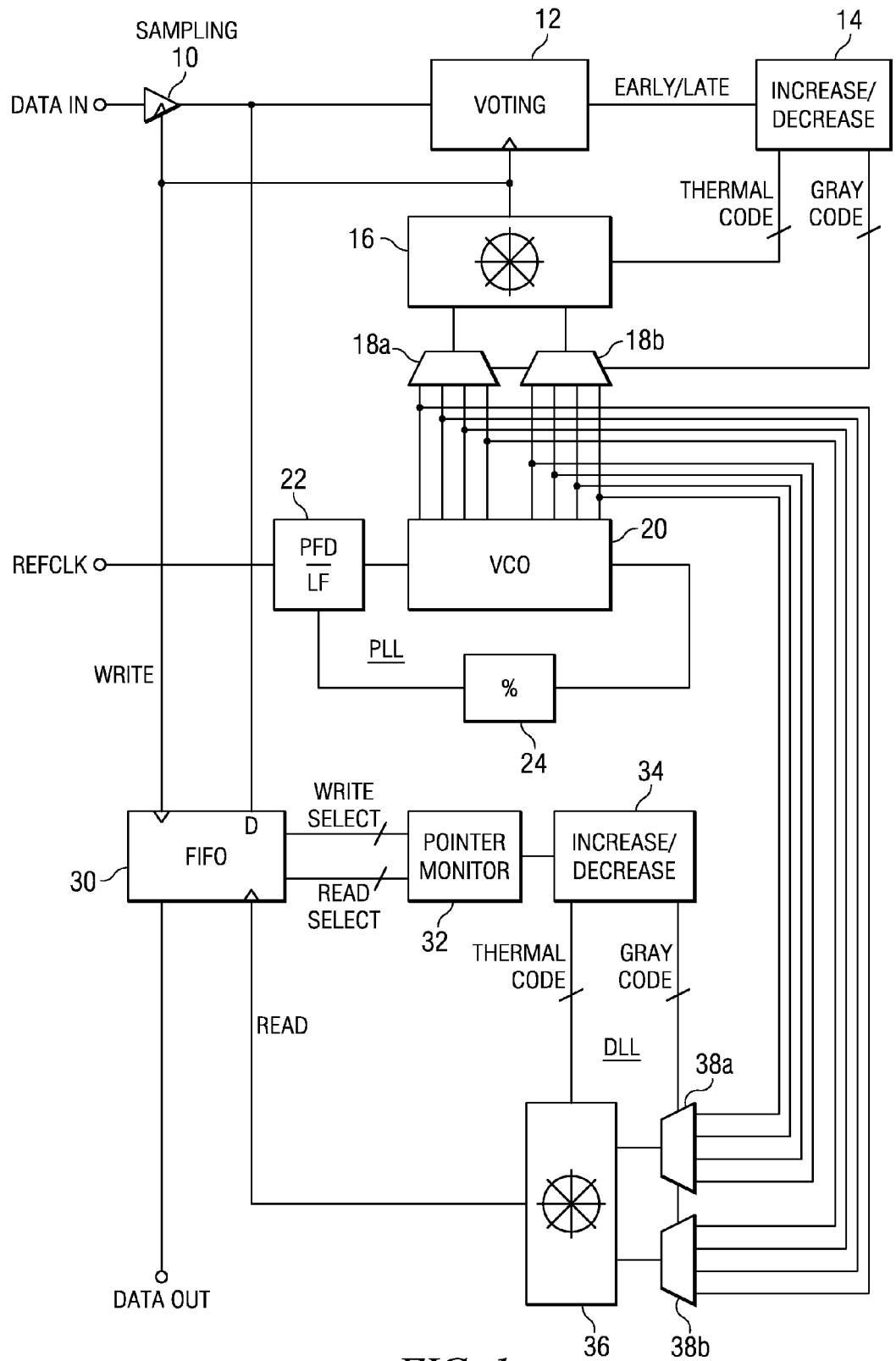
FIG. 1 is a block diagram of the inventive clocked data recovery circuit.

The inventive data recovery circuit in FIG. 1 is a CMOS circuit that includes a sampling circuit 10 with a signal input, a signal output and a sampling clock input. A received signal DATA IN is applied to the signal input. The signal output is connected to an input of a voting circuit 12 that has a clock input and a control output. The voting circuit 12 detects early/late conditions and provides a suitable control signal to an increment/decrement circuit 14 that has two outputs. A first one of the outputs provides a thermometer-coded control signal to a phase interpolator 16; a second one of the outputs provides a Gray-coded control signal to a multiplexer pair 18a, 18b. The phase interpolator 16 has an output connected to the clock inputs of the sampling circuit 10 and the voting circuit 12. The multiplexer pair 18a, 18b has two outputs connected to respective signal inputs of the phase interpolator 16. A phase locked loop (PLL) includes a voltage controlled oscillator (VCO) 20 which, in the specific embodiment disclosed, has eight signal outputs that provide output signals of like frequency but mutually shifted in phase by 360/8°=45°. These outputs are taken from the four stages of a ring oscillator contained in the VCO. Each output is connected to one of the eight inputs of the multiplexer pair 18a, 18b. A control input of the VCO receives a control voltage from a phase/frequency discriminator 22 and loop filter. A reference input of the phase/frequency discriminator 22 receives a reference (or system) clock signal REFCLK, and a feedback input is connected to an output of the voltage controlled oscillator 20 through a frequency divider 24.

The signal output of the sampling circuit 10 is also connected to a data input D of a single bit FIFO buffer 30, which has a write clock input WRITE connected to the output of the phase interpolator 16, a read clock input READ and a data output DATA OUT. A pointer monitor 32 monitors the write select pointers within the FIFO buffer 30 through WRITE SELECT connection lines and the read select pointers through READ SELECT connection lines. The pointer monitor 32 detects possible read/write conflicts within the FIFO and provides an EARLY/LATE control signal to an increment/decrement circuit 34 that has two control outputs. A first one of the outputs provides a thermometer-coded control signal to a phase interpolator 36; a second one of the outputs provides a Gray-coded control signal to a multiplexer pair 38a, 38b. The phase interpolator 36 has an output connected to the read clock input of the FIFO buffer 30. The multiplexer pair 38a, 38b has two outputs connected to respective signal inputs of the phase interpolator 36, and has eight inputs each connected to a different one of the eight outputs of the voltage controlled oscillator 20, in parallel to the eight inputs of the multiplexer pair 18a, 18b.

The arrangement disclosed is a delay locked loop (DLL) that tends to maintain a sufficient separation in time between the write and read operations within the FIFO buffer 30 to avoid any conflict. As the data signal is FIFO buffered and the timing of the data read from the FIFO is determined by the read clock, the hunting jitter on the output of the sampling circuit 10 is eliminated.

Figure 2:
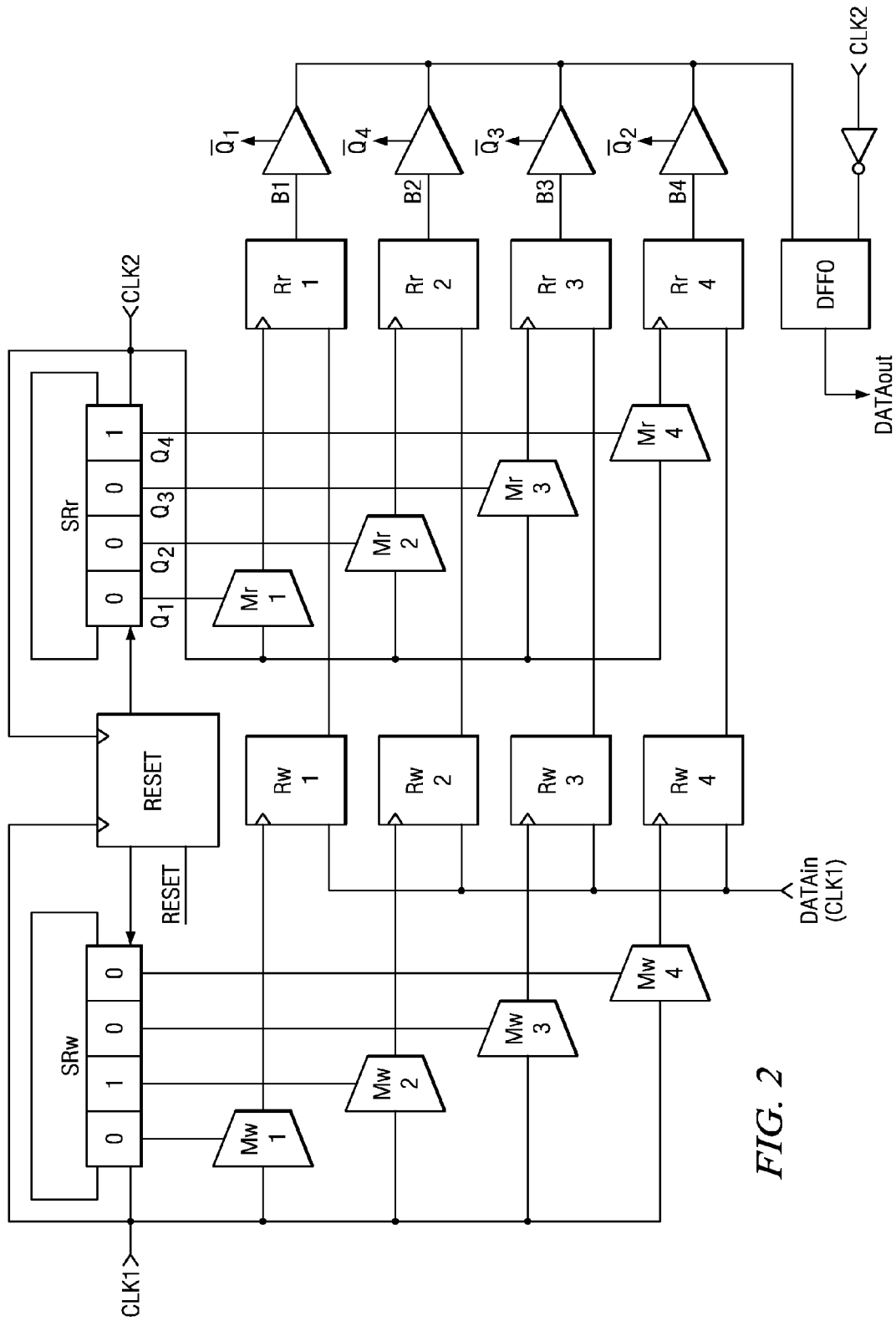
FIG. 2 is a block diagram of a FIFO buffer for use in the circuit of FIG. 1.

A single bit FIFO buffer that can be used in the circuit of FIG. 1 is illustrated in FIG. 2. The FIFO buffer in this example has a depth of four bits, although a five bit depth is preferred.

With reference now to FIG. 2, a register arrangement has four parallel data write registers Rw1 to Rw4 and four parallel data read registers Rr1 to Rr4. Write registers Rw1 to Rw4 have their data inputs connected in parallel to a data input port DATAin. Each write register Rw1 to Rw4 has an output connected to a data input of a corresponding read register Rr1 to Rr4. In the embodiment shown, each register Rw1 to Rw4 and Rr1 to Rr4 is a D-Flip-Flop circuit.

A clock signal CLK1 from a first clock domain, the WRITE clock signal, is selectively applied to a clock input of only one of the write registers Rw1 to Rw4 at a time by means of a write multiplexer arrangement consisting of four parallel multiplexer stages Mw1 to Mw4. Each write multiplexer stage Mw1 to Mw4 has a select input connected to one out of four outputs of a first four-stage shift register, referred to as write shift register SRw.

In a similar manner, a clock signal CLK2 from a second clock domain, the READ clock signal, is selectively applied to a clock input of only one of the read registers Rr1 to Rr4 at a time by means of a read multiplexer arrangement consisting of four parallel multiplexer stages Mr1 to Mr4. Each read multiplexer stage Mr1 to Mr4 has a select input connected to one out of four outputs of a second four-stage shift register, referred to as read shift register SRr.

The outputs of the read registers Rr1 to Rr4 are each connected to an input of one out of four decoupling buffer stages B1 to B4, which have their outputs commonly connected to a data input of a D-Flip-Flop DFF0 clocked by the inverted clock signal CLK2 and the output of which is a data output port DATAout. The decoupling buffer stages B1 to B4 also receive select inputs from inverted outputs $\overline{Q1}$ to $\overline{Q4}$ of read shift register SRr to avoid contention. The selection of buffer stages B1 to B4 is such that one register output is selected at a time and the selected register output to be buffered is one of a register not clocked at the same time.

It should be clear that a five bits deep FIFO, as preferred in the circuit of FIG. 1, would require an additional write register and an additional read register, and the shift registers should have a length of five bits.

Figure 3:
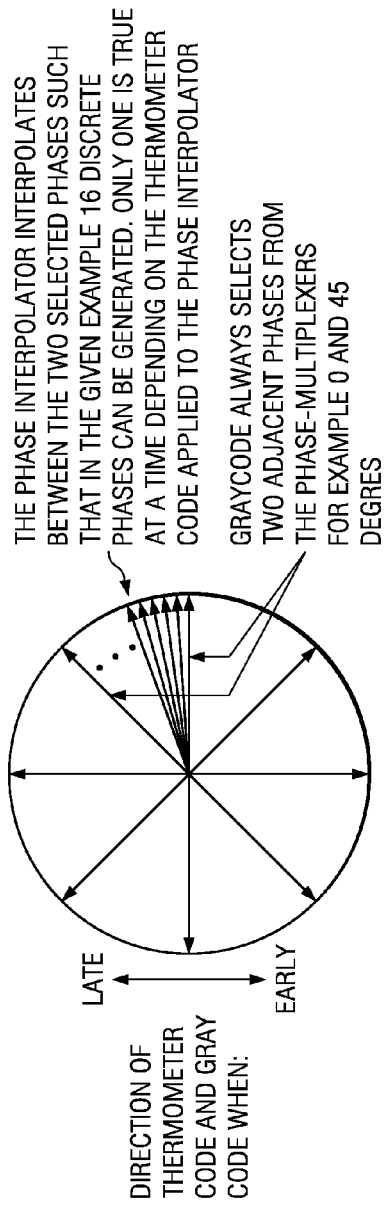
FIG. 3 is a diagram illustrating the operation of a phase interpolator.

A phase interpolator such as 16 or 36 in FIG. 1 receives two input signals of like frequency but mutually phase-shifted by 45°. The 45° phase-shift is ensured by the Gray-coding of the control signal applied to the respective multiplexer pair 18a, 18b or 38a, 38b. As seen in FIG. 3, a full 360° phase circle is divided into eight sectors of 45° each. The Gray code applied selects one of the eight 45° sectors. Within a selected 45° sector, the thermometer code applied to the phase interpolator defines one out of a plurality of split phases within a 45° sector. For example, each 45° sector is divided into n=16 different phase values, and the thermometer code defines one out of the n phase values.

In operation, the voting circuit 12 adjusts the sampling clock applied to the sampling circuit 10. As a result, the recovered data will be affected by a hunting jitter, as explained. The hunting jitter is eliminated by the FIFO buffering, but care must be taken to avoid any write/read conflict within the FIFO buffer. The pointer monitor 32 ensures that there is always a sufficient delay between write and read operations for the same bit by adjusting the phase of the read clock through the phase interpolator 36.

Figure 4A:
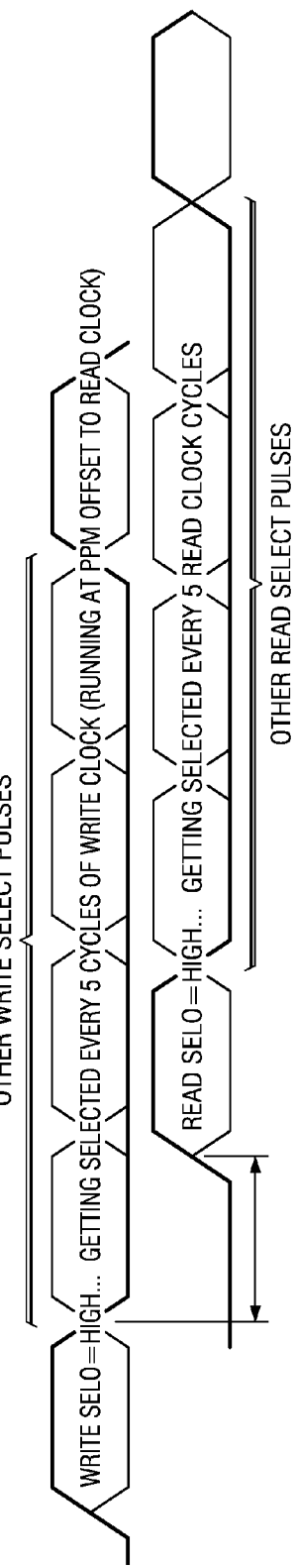
FIG. 4a is diagram illustrating an "early" situation detected by a pointer monitor in the circuit of FIG. 1.

With reference to FIG. 4a, an example of an "early" situation is illustrated where the write selection gets close to the read selection. In that case, and only in that case, a phase step is added to move the read select to a later point in time.

Figure 4B:
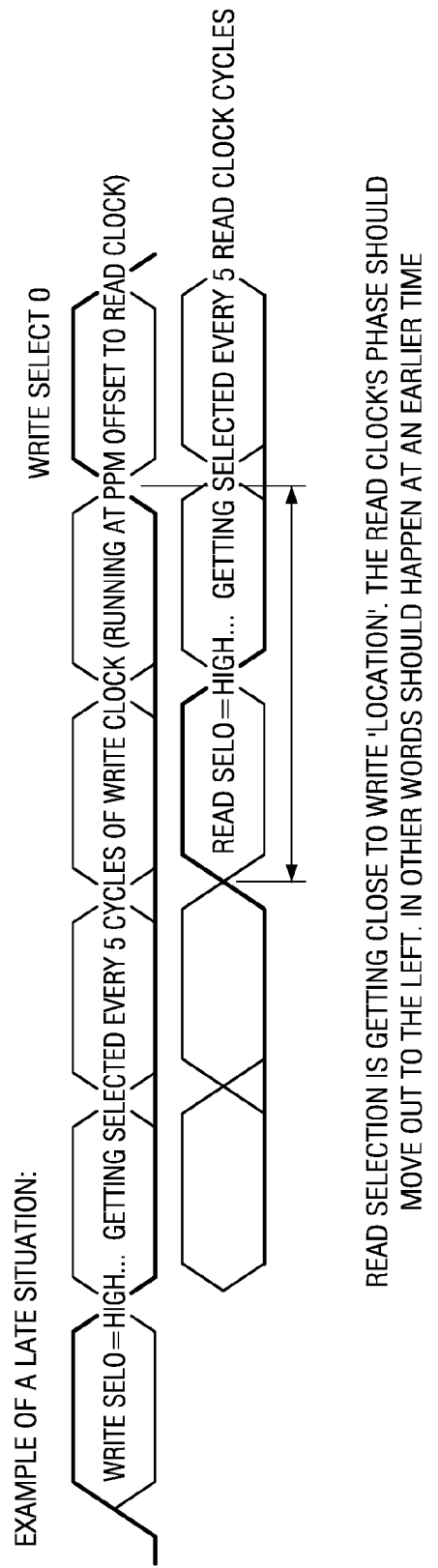
FIG. 4b is diagram illustrating a "late" situation detected by the pointer monitor in the circuit of FIG. 1.

With reference to FIG. 4b, an example of a "late" situation is illustrated where the read selection gets close to the write selection. In that case, and only in that case, a phase step is removed to move the read select to an earlier point in time.

As seen from these examples, there should always be a complete cycle between a read selection and a write selection; but the read clock should not be altered without need, to avoid adding new jitter to the recovered data signal. Therefore, phase steps of the phase interpolator occur only in case of a detected "early" or "late" condition.

In the embodiment disclosed, digital data are recovered from a clocked serial input signal. The input signal is sampled with a sampling clock signal supplied by a first phase interpolator to obtain a sampled digital signal. The first phase interpolator is controlled with a voting circuit to adjust the phase of the sampling clock relative to the eye in the eye-diagram of the input signal. The first phase interpolator has signal inputs connected to signal outputs of a voltage controlled oscillator in a phase-locked loop circuit that has a reference signal input to which the reference clock signal is applied. The sampled digital signal is written to a single-bit FIFO buffer with a write clock signal that has the same timing as the sampling clock. A filtered output signal is read from the FIFO buffer with a read clock signal supplied by a second phase interpolator that has signal inputs connected to the signal outputs of the voltage controlled oscillator in the phase-locked loop. The second phase interpolator is controlled with a pointer monitor that monitors the write and read select pointers in the FIFO buffer to adjust the timing of the read clock signal relative to the write clock signal. With this method, the hunting jitter is filtered out while a frequency offset is still allowed between the reference clock and the data signal.

The invention claimed is:

1. A method of recovering digital data from a clocked serial input signal including the steps of:
   sampling the input signal with a sampling clock to obtain a sampled digital signal;
   writing the sampled digital signal to a FIFO buffer with a write clock signal that has the same timing as the sampling clock;
   reading a filtered output signal from the FIFO buffer with a read clock signal supplied by a phase interpolator that receives two different ones of mutually phase-shifted clock signals synchronized with the sampling clock; and
   controlling the phase interpolator with a pointer monitor that monitors the write and read select pointers in the FIFO buffer to adjust the timing of the read clock signal relative to the write clock signal.

2. The method of claim 1, wherein the pointer monitor controls the phase interpolator in a manner to force a phase step when the amount of a timing offset between the write and read select pointers in the FIFO buffer exceeds a preset limit.

3. The method of claim 2, wherein the preset limit is determined in relation to the depth of the FIFO buffer to ensure a safety margin between write and read operations while minimizing the frequency of phase steps of the phase interpolator.

4. A clocked data recovery circuit comprising:
   a sampling circuit with a signal input for application of a clocked serial input signal, a signal output and a sampling clock input for application of a sampling clock signal;
   a FIFO buffer with a data input connected to the signal output of the sampling circuit, with a data output, with a write clock input to which the sampling clock is applied, and with a read clock input;
   a phase interpolator with two signal inputs, a phase control input and an output connected to the read clock input of the FIFO buffer;
   a multiplexer with a control input for selectively connecting the two signal inputs of the phase interpolator to two different ones of mutually phase-shifted clock signals that are synchronized with the sampling clock; and
   a pointer monitor that monitors write and read select pointers in the FIFO buffer to adjust the timing of the read clock relative to the write clock so that a timing offset between the write and read select pointers in the FIFO buffer is maintained within preset limits.

5. A method of recovering digital data from a clocked serial input signal, comprising:
   sampling the input signal with a sampling clock signal supplied by a first phase interpolator to obtain a sampled digital signal; the first phase interpolator being controlled to adjust the phase of the sampling clock relative to an eye of the input signal; the first phase interpolator having signal inputs connected to receive signal outputs of a voltage controlled oscillator in a phase-locked loop circuit to which a reference clock signal is applied;
   writing the sampled input signal to a single-bit FIFO buffer with a write clock signal that has the same timing as the sampling clock;
   reading an output signal from the FIFO buffer with a read clock signal supplied by a second phase interpolator that has signal inputs connected to receive the signal outputs of the voltage controlled oscillator in the phase-locked loop; the second phase interpolator being controlled with a pointer monitor that monitors write and read select pointers in the FIFO buffer to adjust the timing of the read clock signal relative to the write clock signal.

6. The method of claim 5, wherein the first phase interpolator is controlled with a voting circuit to adjust the phase of the sampling clock relative to the eye of the input signal.

7. The method of claim 5, wherein the output signal read from the FIFO buffer with the read clock signal supplied by the second phase interpolator is a filtered output signal.

8. A circuit for recovering digital data from a clocked serial input signal, comprising:
   a sampling circuit for sampling the input signal with a sampling clock signal to obtain a sampled digital signal;
   a first phase interpolator connected to supply the sampling clock signal to the sampling circuit;
   a phase-locked loop circuit including a voltage controlled oscillator having an input connected to receive a reference clock signal and connected to supply outputs to the first phase interpolator;
   a single-bit FIFO buffer connected for writing the sampled input signal with a write clock signal that has the same timing as the sampling clock; and further connected for supplying a filtered output signal by reading the written signal with a read clock signal;
   a second phase interpolator connected to supply the read clock signal to the FIFO buffer; the second phase interpolator connected to receive the outputs of the voltage controlled oscillator; and
   a pointer monitor connected for monitoring the write and read select pointers in the FIFO buffer to adjust the timing of the read clock signal relative to the write clock signal.

9. The circuit of claim 8, further comprising a voting circuit connected for controlling the first phase interpolator, to adjust the phase of the sampling clock relative to an eye of the input signal.

* * * * *